(12) United States Patent
Fedorov et al.

(10) Patent No.: US 12,094,701 B2
(45) Date of Patent: Sep. 17, 2024

(54) SPECIMEN IMAGING SYSTEMS AND METHODS

(71) Applicant: Georgia Tech Research Corporation, Atlanta, GA (US)

(72) Inventors: Andrei G. Fedorov, Atlanta, GA (US); Peter Arthur Kottke, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 401 days.

(21) Appl. No.: 17/763,294

(22) PCT Filed: Oct. 2, 2020

(86) PCT No.: PCT/US2020/054043
§ 371 (c)(1),
(2) Date: Mar. 24, 2022

(87) PCT Pub. No.: WO2021/067781
PCT Pub. Date: Apr. 8, 2021

(65) Prior Publication Data
US 2022/0344138 A1 Oct. 27, 2022

Related U.S. Application Data

(60) Provisional application No. 62/910,691, filed on Oct. 4, 2019.

(51) Int. Cl.
*H01J 49/00* (2006.01)
*H01J 37/20* (2006.01)
(Continued)

(52) U.S. Cl.
CPC .......... *H01J 49/0004* (2013.01); *H01J 37/20* (2013.01); *H01J 37/26* (2013.01); *H01J 49/147* (2013.01)

(58) Field of Classification Search
CPC ........ H01J 49/0004; H01J 37/20; H01J 37/26; H01J 49/147; H01J 37/023;
(Continued)

(56) References Cited

U.S. PATENT DOCUMENTS 6,858,840 B2 * 2/2005 Berkout ................ H01J 49/063
250/281
7,939,797 B2 5/2011 Schneider
(Continued)

FOREIGN PATENT DOCUMENTS

EP 1010468 A1 6/2000

OTHER PUBLICATIONS

International Search Report and Written Opinion from Application No. PCT/US2020/054043 dated Feb. 25, 2021.

*Primary Examiner* — David A Vanore
(74) *Attorney, Agent, or Firm* — Troutman Pepper Hamilton Sanders LLP; Ryan A. Schneider; Chris N. Davis

(57) ABSTRACT

Disclosed herein are specimen imaging systems, comprising: a sample stage in a vacuum environment, the sample stage configured to support a specimen; an electron beam generator configured to focus an electron beam on a first predetermined location on the specimen; a nanospray dispenser configured to dispense a nanospray onto a second predetermined location on the specimen; a mass spectrometer; and an extraction conduit configured to extract a plume of charged particles generated as a result of contact between the nanospray and the specimen and deliver the charged particles to the mass spectrometer. The system can create a topological and chemical map of the specimen by analyzing at least a portion of the specimen with a mass spectrometer to determine a chemical composition of the specimen at the second predetermined location and analyzing at least a
(Continued)

portion of the specimen with the electron beam to determine a surface topology.

20 Claims, 6 Drawing Sheets

(51) Int. Cl.
  *H01J 37/26* (2006.01)
  *H01J 49/14* (2006.01)
(58) Field of Classification Search
  CPC ............. H01J 2237/006; H01J 2237/05; H01J 2237/2067; H01J 2237/2803; H01J 49/142
  See application file for complete search history.

(56) References Cited

U.S. PATENT DOCUMENTS

| | | | | |
|---|---|---|---|---|
| 8,286,260 | B2 | 10/2012 | Vertes et al. | |
| 8,598,521 | B2 * | 12/2013 | Levis | H01J 49/145 |
| | | | | 250/281 |
| 9,218,947 | B2 * | 12/2015 | Verbeck, IV | H01J 49/0027 |
| 9,279,778 | B2 * | 3/2016 | Beckman | H01J 49/0431 |
| 9,831,078 | B2 * | 11/2017 | Land | H01J 49/162 |
| 11,275,029 | B2 * | 3/2022 | Hutchinson | G01J 3/443 |
| 11,699,582 | B2 * | 7/2023 | Makarov | H01J 37/18 |
| | | | | 250/505.1 |
| 2002/0138210 | A1 * | 9/2002 | Wilkes | G01N 33/6851 |
| | | | | 702/28 |
| 2011/0084203 | A1 * | 4/2011 | Basile | H01J 49/0468 |
| | | | | 530/344 |
| 2012/0149009 | A1 * | 6/2012 | Levis | H01J 49/145 |
| | | | | 435/5 |
| 2012/0286149 | A1 | 11/2012 | Gamero-Castano et al. | |
| 2013/0026359 | A1 * | 1/2013 | Kumashiro | H01J 49/10 |
| | | | | 250/288 |
| 2015/0076339 | A1 * | 3/2015 | Fedorov | H01J 49/0431 |
| | | | | 250/288 |
| 2015/0168318 | A1 * | 6/2015 | Beckman | H01J 49/0431 |
| | | | | 250/311 |
| 2018/0178227 | A1 * | 6/2018 | Fedorov | B05B 5/0255 |
| 2022/0084806 | A1 * | 3/2022 | Makarov | H01J 37/02 |
| 2023/0280245 | A1 * | 9/2023 | Konijnenberg | G01N 23/2202 |
| | | | | 250/443.1 |

* cited by examiner

SPECIMEN IMAGING SYSTEMS AND METHODS

CROSS-REFERENCE TO RELATED APPLICATIONS

This application claims the benefit of U.S. Provisional Application Ser. No. 62/910,691, filed on 4 Oct. 2019 the entire contents and substance of which is incorporated herein by reference in its entirety as if fully set forth below.

STATEMENT OF RIGHTS UNDER FEDERALLY SPONSORED RESEARCH

This invention was made with government support under Contract No. DE-SC0010729 awarded by the U.S. Department of Energy and Contract No. 1648035 awarded by the National Science Foundation. The government has certain rights in the invention.

FIELD OF THE DISCLOSURE

The present disclosure relates generally to specimen imaging systems and methods. Particularly, embodiments of the present disclosure relate to systems and methods for topological and chemical mapping of specimens.

BACKGROUND

Improved spatial resolution in biological and biochemical observation and measurement has been recognized as a key goal in development of instruments and methodologies for health related basic science research, as the richness of data sets and their potential for leading to transformative discoveries is significantly increased when factors such as heterogeneity and co-localization are revealed. For instance, improvements in resolution are crucial in efforts to investigate tumor heterogeneity, including studies of evolution of tumor non-uniform response to treatment pressures, a recently recognized area of importance for cancer research. Similarly, the progression of diseases can be better understood with better resolved imaging at the cellular level, as highlighted by the recognition of the importance of measurement of cell heterogeneity in the elucidation of the role of impairment of beta cell function in type 1 diabetes pathogenesis. In fact, analysis at the level of a single cell or with subcellular resolution has been seen as a next frontier in the "omics" approach to discovery. Numerous methods have been developed to address the need for highly resolved detection of biochemicals. Labeling, with, for instance, a fluorescent or radioactive marker, or antigen/antibody attachment, has been spectacularly successful, but concerns about the altering of labeled analyte behavior and non-specific binding cannot be eliminated. Furthermore, all targeted methods, including those based on labeling, are inherently limited in their discovery potential, as one cannot find what one is not looking for.

Mass spectrometry is a powerful analysis method because it allows identification of multiple, possibly unanticipated, chemicals simultaneously, displaying considerable chemical specificity and sensitivity. Furthermore, in studies of proteins, it allows for the detection of important post-translational modifications. Imaging mass spectrometry (IMS), which does not entail tedious sample extraction uses a scanned ion source with MS analysis to act as a chemical microscope in which untargeted in situ chemical analysis results can be correlated with the sample histology and morphology. IMS has used ionization methods including ion beam surface sputtering (SIMS), laser ablation (MALDI, MALDESI), and charged droplet impingement (DESI) with best spatial resolutions of 50 nm for the first, and ~10 µm for the latter methods. Although SIMS exhibits the best resolution, it is not a soft ionization method and therefore is poorly suited for most biology related IMS. SIMS without labelling or tagging in some manner is severely limited due to fragmentation with all information inferred from detection of monatomic or diatomic species. DESI has the worst spatial resolution but has found a role in lipid mapping, while MALDI has slightly better spatial resolution and tends to induce higher charge states, rendering it the current IMS approach of choice for proteins.

What is needed, therefore, are improved specimen imaging systems and methods that exhibit less fragmentation than SIMS, provides a better spatial resolution than DESI, and requires fewer pretreatment steps than MALDI. Embodiments of the present disclosure address this need as well as other needs that will become apparent upon reading the description below in conjunction with the drawings.

BRIEF SUMMARY OF THE DISCLOSURE

The present disclosure relates generally to specimen imaging systems and methods. Particularly, embodiments of the present disclosure relate to systems and methods for topological and chemical mapping of specimens.

An exemplary embodiment of the present disclosure can provide a specimen imaging system, comprising: a sample stage in a vacuum environment, the sample stage configured to support a specimen; an electron beam generator configured to generate an electron beam and focus the electron beam on a first predetermined location on the specimen; a nanospray dispenser configured to dispense a nanospray onto a second predetermined location on the specimen; a mass spectrometer; and an extraction conduit in fluid communication with the mass spectrometer and configured to extract a plume of charged particles generated as a result of contact between the nanospray and the specimen and deliver the charged particles to the mass spectrometer.

In any of the embodiments disclosed herein, the first predetermined location can be a same location as the second predetermined location.

In any of the embodiments disclosed herein, the first predetermined location can be a different location than the second predetermined location.

In any of the embodiments disclosed herein, the electron beam generator can be positioned above the sample stage.

In any of the embodiments disclosed herein, the nanospray dispenser can be oriented towards to the sample stage.

In any of the embodiments disclosed herein, the nanospray dispenser can be configured to dispense the nanospray onto the second predetermined location of the specimen and the electron beam generator can be configured to focus the electron beam onto the first predetermined location of the specimen, simultaneously.

In any of the embodiments disclosed herein, the nanospray dispenser can be configured to dispense the nanospray onto the second predetermined location of the specimen during a first time period, and the electron beam generator can be configured to focus the electron beam onto the first predetermined location of the specimen during a second time period, wherein the first time period is different than the second time period.

In any of the embodiments disclosed herein, the nanospray dispenser can be configured to dispense a nanospray onto the second predetermined location, such that the nanospray contacts the specimen as a charged, continuous liquid filament.

In any of the embodiments disclosed herein, the nanospray dispenser can be configured to dispense a nanospray onto the second predetermined location, such that the nanospray contacts the specimen as a plurality of charged droplets.

In any of the embodiments disclosed herein, the nanospray dispenser can be further configured to dispense a transport gas laterally across the sample stage, such that the transport gas carries at least a portion of the specimen that is forcibly desorbed from the specimen by the nanospray toward the extraction conduit.

In any of the embodiments disclosed herein, the nanospray dispenser can comprise a first outlet for ejecting the nanospray and a second outlet for ejecting the transport gas.

In any of the embodiments disclosed herein, the specimen can comprise one or more biological cells.

In any of the embodiments disclosed herein, the nanospray dispenser can be configured to cause the nanospray to forcibly desorb a portion of the specimen.

In any of the embodiments disclosed herein, the extraction conduit can be configured to receive the portion of the specimen forcibly desorbed and can transfer the portion of the specimen forcibly desorbed to the mass spectrometer.

In any of the embodiments disclosed herein, the system can further comprise a processor and a memory storing instructions that, when executed by the processor, cause the specimen imaging system to create a topological and chemical map of the specimen.

In any of the embodiments disclosed herein, the topological and chemical composition map can be created by analyzing at least a portion of the specimen with a mass spectrometer to determine a chemical composition of the specimen at the second predetermined location.

In any of the embodiments disclosed herein, the map can be created by analyzing at least a portion of the specimen with the electron beam to determine a surface topology.

In any of the embodiments disclosed herein, the map can have a spatial resolution of 10 µm or less.

In any of the embodiments disclosed herein, the map can have a spatial resolution from 0.1 µm to 10 µm.

Also disclosed herein are methods of imaging a specimen, such methods comprising: positioning a specimen on a sample stage within a vacuum environment; profiling at least a portion of the surface of the specimen with an electron beam from an electron beam generator to obtain a surface topology, the electron beam being focused on a first predetermined location on the specimen; dispensing a nanospray from a nanospray dispenser onto a second predetermined location on the specimen; forcibly desorbing a portion of the specimen with the nanospray; and transferring the portion of the specimen from the vacuum environment into an extraction conduit in fluid communication with a mass spectrometer.

In any of the embodiments disclosed herein, the nanospray can have an energy per impacting molecule of 1 eV or less.

In any of the embodiments disclosed herein, the nanospray can have an energy per impacting molecule from 0.001 eV to 1 eV.

These and other aspects of the present disclosure are described in the Detailed Description below and the accompanying figures. Other aspects and features of embodiments of the present disclosure will become apparent to those of ordinary skill in the art upon reviewing the following description of specific, exemplary embodiments of the present invention in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The accompanying drawings, which are incorporated in and constitute a part of this specification, illustrate multiple embodiments of the presently disclosed subject matter and serve to explain the principles of the presently disclosed subject matter. The drawings are not intended to limit the scope of the presently disclosed subject matter in any manner.

DETAILED DESCRIPTION

Figure 1:
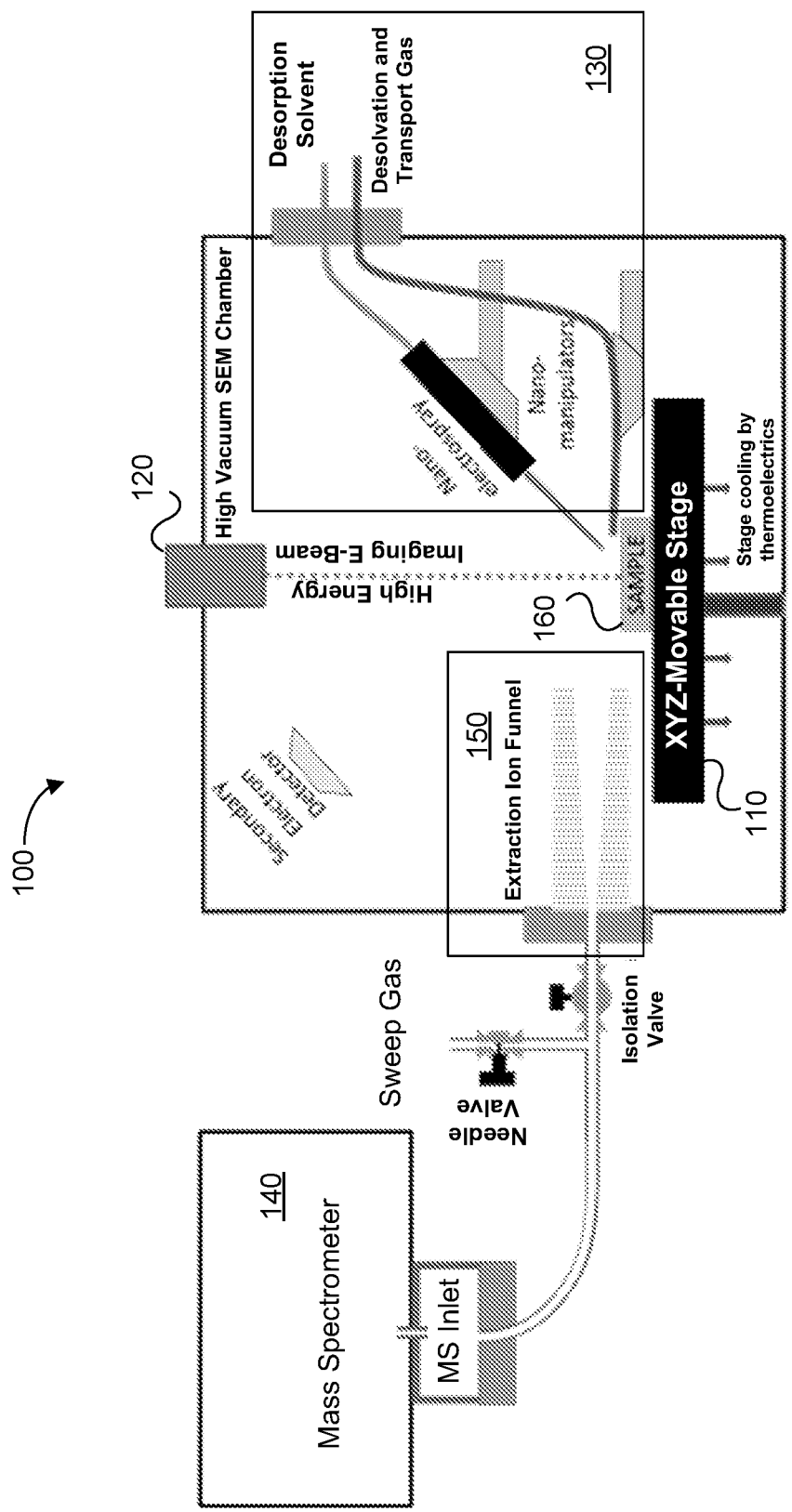
FIG. 1 illustrates a specimen imaging system according to some examples of the present disclosure.

Disclosed herein are systems and methods for imaging mass spectroscopy (IMS) that improve upon the best features of the current approaches. The new technology, named BeamMap for Beam Enabled Accurate Mapping & Molecular Analyte Profiling, is a multimodal imaging approach, using electron microscopy (EM) for visualization of topography and/or EM stained features at resolutions up to approximately 10 nm, along with electrospray (ES) impingement for analyte desorption and charging with subsequent MS detection with expected achievable sub-micron (approximately 100 nm) resolution. The disclosed systems can provide IMS with (i) the spatial resolution of SIMS, (ii) the ability to yield high charges states enabling detection of proteins as in MALDI, and (iii) the "softness" (ability to avoid undesired fragmentation) of ES based imaging.

The disclosed systems can use an electron beam for multiple purposes: it can enable imaging of topology and electron microscopy stained features, it can provide localized heating to promote desorption, and it can allow precise determination of the location of the spray capillary and electrospray impact area. The nanospray liquid beam can be used to desorb and charge analytes for chemical imaging in the disclosed systems. It can be produced and transmitted in an SEM chamber vacuum, which can enable significant acceleration to velocities and energies above those achievable in atmospheric pressure, thus making possible depth profiling through sample ablation, promoting higher charge states, and reducing imaged spot size yielding improved spatial resolution.

In the disclosed systems the electrospray tip and gas capillary can be positioned relative to the extraction ion funnel to yield optimal collection and desolvation, and the sample can then be moved in the X-Y direction to change the location of spray impact and in the Z direction to alter the spray-to-sample distance. Increasing and/or decreasing the spray-to-sample distance can increase/decrease the energy content of the impacting droplets as well as the impacting plume diameter (and hence sampled spot size), thus allowing for optimization of spatial resolution and sensitivity. The injected gas can be heated to change velocity (molecular temperature) of the gas.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter.

As used herein, the term "specimen" can refer to any plurality of biological cells, living or dead, and/or any number of other biomaterials, including, but not limited to, any single instance or plurality of lipids, proteins, carbohydrates, or other biological macromolecules.

As used herein, the term "fluid communication" can refer to any pathway through which a plurality of particles can flow. In other words, two objects can be in fluid communication when particles can flow from one object to the other, including with the assistance of an outside force.

Reference will now be made in detail to exemplary embodiments of the disclosed technology, examples of which are illustrated in the accompanying drawings and disclosed herein. Wherever convenient, the same references numbers will be used throughout the drawings to refer to the same or like parts.

FIG. 1 illustrates a specimen imaging system 100. The system 100 can comprise a sample stage 110, an electron beam generator 120, a nanospray dispenser 130, a mass spectrometer 140, and an extraction conduit 150. The sample stage 110 can be configured to support a specimen 160. The sample stage 110, and therefore the specimen 160, can be maintained in a vacuum environment. The extraction conduit 150 can be in fluid communication with the mass spectrometer 140 and configured to extract particles from the vacuum environment and/or the specimen 160.

Figure 2:
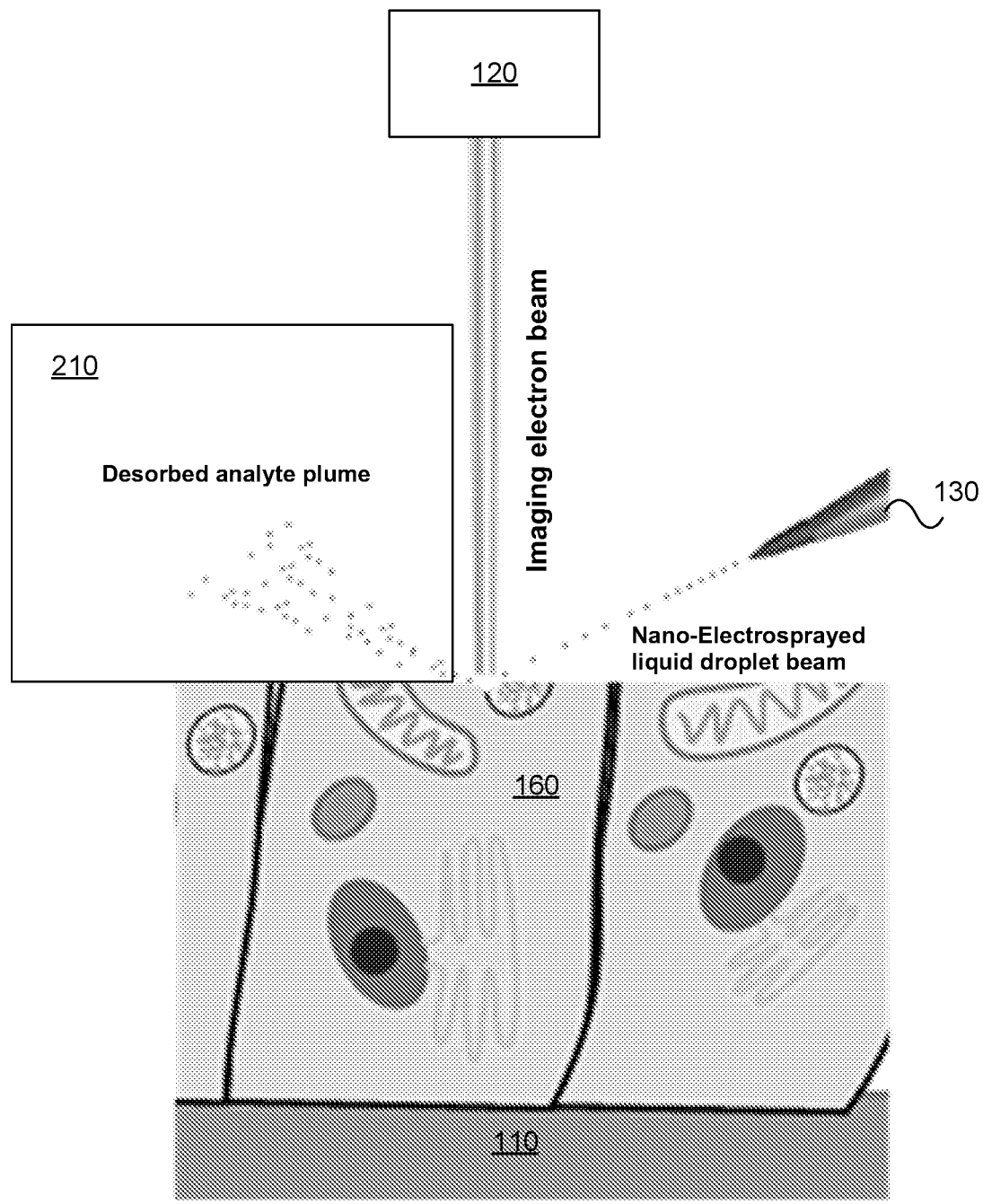
FIG. 2 illustrates a specimen imaging system according to some examples of the present disclosure.

As shown, the electron beam generator 120 can be positioned above the sample stage 110, and the nanospray dispenser 130 can be oriented generally towards the sample stage 110. Both the electron beam generator 120 and the nanospray dispenser 130 can be positioned at any angle and/or height relative to the sample stage 110 as desired. As shown in FIG. 2, the electron beam generator 120 can focus the electron beam on a first predetermined location on the specimen 160, and the nanospray dispenser 130 can be configured to dispense a nanospray onto a second predetermined location on the specimen.

The first predetermined location and the second predetermined location can be the same, as shown in FIG. 2. However, the first predetermined location and the second predetermined location can, in fact, be different locations if desired. Additionally, the nanospray dispenser 130 can be configured to dispense the nanospray onto the second predetermined location of the specimen 160 at the same time as the electron beam generator 120 can be configured to focus the electron beam onto the first predetermined location of the specimen 160. However, the electron beam and the nanospray need not act simultaneously. The nanospray dispenser 130 can dispense the nanospray onto the second predetermined location during a first time period. Similarly, the electron beam generator 120 can focus the electron beam onto the first predetermined location during a second time period. The first time period can be different than the second time period both in terms of chronology and in duration. Alternatively, the first time period can be the same as the second time period both in terms of chronology and in duration. Although the different time periods are referred to as a first and second time period, the terms "first" and "second" are not intended to limit the chronology of the time periods. In other words, the second time period can occur before the first time period, and vice versa, with any amount of overlap considered between the first and the second time periods.

When contacting the specimen 160, the nanospray dispenser 130 can dispense a nanospray configured to create a plume of charged particles 210 desolvated from the specimen 160. The plume of charged particles 210 can include solid particles, liquid phase particles, isolated ions, or any combinations thereof. The plume of charged particles can be extracted by the extraction conduit. To expel the plume of charged particles 210, the nanospray dispenser 130 can dispense the nanospray such that the nanospray contacts the specimen 160 in the form of a charged, continuous liquid filament. Alternatively, the nanospray dispenser 130 can dispense the nanospray such that the nanospray contacts the specimen 160 in the form of a plurality of charged droplets.

The extraction conduit 150 can accept the plume of charged particles 210, transmitting and focusing them through a small exit portal for further desolvation/transmission to the mass spectrometer 140. It can comprise a linear array of coaxially aligned ring electrodes with decreasing diameters and can be capable of operation at pressures from high vacuum to those required for Environmental SEM (ESEM), i.e., up to approximately 10 ton. The total length can be approximately 15 cm and the outer diameter can be approximately 4 cm, with inner diameter varying from approximately 20 mm to 1 mm. A baseline voltage gradient can be applied to the ring electrodes using resistors between each to act as voltage dividers, with separately controlled potentials applied to end electrodes. Superimposed on the DC potentials are RF voltages (of opposite phase in adjacent electrodes), creating a potential well along the funnel axis.

To aid in the desolvation of the plume of charged particles 210 from the specimen 160, the nanospray dispenser 130 can be further configured to dispense a transport gas. The transport gas can be dispensed in a direction such that the transport gas carries at least a portion of the plume of charged particles 210 toward the extraction conduit 150. To that end, the nanospray dispenser 130 can include one or more outlets for ejecting the nanospray, the transport gas, and other components. The outlets can be any conduit for dispensing material, such as tubes, pipes, and the like. In some embodiments, the outlets can be located within a single body of the nanospray dispenser. In some embodiments, the outlets can include separate conduits not located within any single body of the nanospray dispenser.

Figure 3:
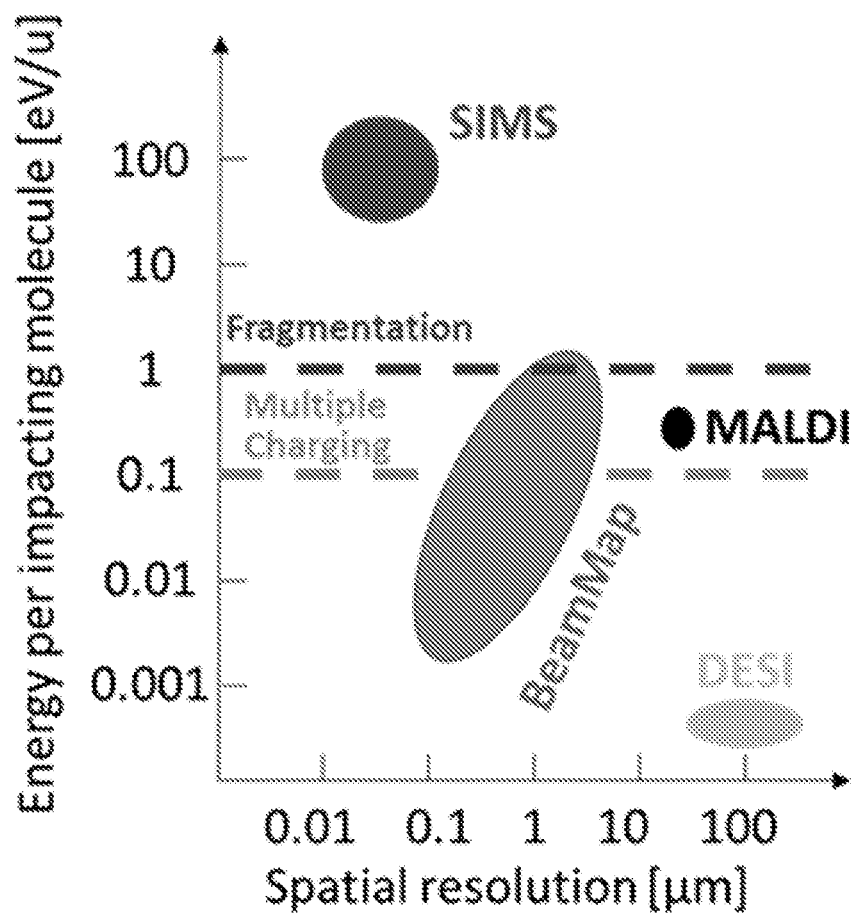
FIG. 3 illustrates the spatial resolution and impacting energy required for the specimen imaging systems according to some examples of the present disclosure.

Using the mass spectrometer 140 to analyze the plume of charged particles 210, the system 100 can obtain a chemical composition of the specimen 160. Using the electron beam generator 120, the system 100 can obtain a topological map of the surface topology of the specimen 100. In such a manner, the system 100 is able to image various specimens with a greater spatial resolution than existing methods, while subjecting the specimen 160 to significantly less energy levels to keep the specimen intact, as shown in FIG. 3.

The nanospray dispenser 130 can utilize spray in a vacuum to enable the nanospray to gain a higher velocity in a manner similar to massive cluster bombardment (MCI) and electrosprayed droplet impact (EDI) which both yield droplet kinetic energies of approximately 1 MeV corresponding to 1 eV per impacting molecule. MCI and EDI results indicate that higher impact energies increase the achievable charge state of desorbed proteins. In the present system 100, resolution and droplet energy (velocity) can be controlled through applied electric field strength (bounded by ESI limits and spark formation, approximately 2-6 MV/m), tip size (from sub-micron up to approximately 10 µm), tip-to-substrate separation (which governs flight time and hence final velocity in the absence of drag), and solvent composition (which dictates evaporation rate).

Using SEM imaging to monitor spray tip-to-substrate distance, the present system 100 has the capability to control this spacing with to approximately 5 µm resolution using micrometer stages, and with piezo-actuated nano-manipulators (already demonstrated for focused gas jet delivery). As a result, the system 100 can enable variation of impacting droplet energies from the 100 keV to 10 MeV range, with lower energy corresponding to better resolution (opposite the general trend for related imaging techniques). The manner in which the system 100 fits into a "sweet spot" of the energy and impacting droplet/particle beam size (resolution) landscape is depicted in FIG. 3.

Resolution remains an important aspect of the disclosed systems. Resolution is not simply a function of sampling resolution (which is depicted in FIG. 3) but can also be limited by mass analyzer sensitivity and analyte concentration in the specimen. Instrument sensitivity for ESI-MS is a complex issue, but using, for example, an LTQ-Orbitrap mass spectrometer, which is an affordable option for proteomics research, under typical operation, approximately $10^8$ molecules are required for detection (although for very highly charged analytes single molecule detection has been reported). For free metabolites in the cell, with concentrations ranging from 100 nM to 100 mM, assuming good ionization and ignoring signal suppression, detection volumes range from approximately $10^{-17}$ L to $10^{-11}$ L, i.e., "voxels" of dimension 250 nm to 2.5 µm. For membrane lipids and cholesterols typical head group areas of 0.54 $nm^2$ to 0.8 $nm^2$ can be used to find that the sensitivity limited resolution will be as good as approximately 1 µm, with resolution decreasing for membrane domains with less uniform compositions.

Protein detection would appear to give the worst resolution, as the number of proteins in a cell ranges from 5 to 30 million, and thus 10+ cells must be sampled for best case protein detection, with many more required for low abundance proteins. This limitation can be mitigated by enhanced sensitivity observed for higher charge states, with charge state increased using "super-charging" solvents. While mass analyzer sensitivity can limit current IMS spatial resolution, improvements in mass analyzer sensitivity and resolution, as well as reduction in cost, have been desired to be improved with higher resolving power and faster instruments released by MS manufacturers every year. Thus, improvements in mass analyzer sensitivity should make possible detection of even low abundance proteins at the single cell level soon, provided the imaging and ionization technology is not a bottleneck, which highlights the fact that this area be actively developed to keep pace with mass analyzer progress, urgently motivating the proposed IMS tool development and application.

As shown, the created map can have a spatial resolution of 10 µm or less (e.g., 9 µm or less, 8 µm or less, 7 µm or less, 6 µm or less, 5 µm or less, 4 µm or less, 3 µm or less, 2 µm or less, or 1 µm or less). In some examples, the map can have a spatial resolution from 0.1 µm to 10 µm (e.g., from 0.1 µm to 9 µm, from 0.1 µm to 8 µm, from 0.1 µm to 7 µm, from 0.1 µm to 6 µm, from 0.1 µm to 5 µm, from 0.1 µm to 4 µm, from 0.1 µm to 3 µm, from 0.1 µm to 2 µm, or from 0.1 µm to 1 µm).

Also as shown, the energy of the nanospray contacting the specimen 160 can be 1 eV or less (e.g., 0.9 eV or less, 0.8 eV or less, 0.7 eV or less, 0.6 eV or less, 0.5 eV or less, 0.4 eV or less, 0.3 eV or less, 0.2 eV or less, 0.1 eV or less, 0.05 eV or less, 0.01 eV or less, or 0.005 eV or less) per impacting molecule. In some examples, the energy of the nanospray contacting the specimen 160 can be from 0.001 eV to 1 eV (e.g., from 0.001 eV to 0.9 eV, from 0.001 eV to 0.7 eV, from 0.001 eV to 0.6 eV, from 0.001 eV to 0.5 eV, from 0.001 eV to 0.4 eV, from 0.001 eV to 0.3 eV, from 0.001 eV to 0.2 eV, from 0.001 eV to 0.1 eV, or from 0.001 eV to 0.01 eV) per impacting molecule.

As described above, the sample stage 110 can move in three dimensions to adjust the position of the specimen 160. Adjusting the position of the specimen 160 can change the first position and/or the second position. The position of the specimen 160 can also be changed to alter the distance between the specimen 160 and the electron beam generator 120 and/or the nanospray dispenser 130. Therefore, the specific energy of the electron beam and the nanospray can be finely tuned as desired.

Similarly, the relative position of the sample stage with respect to the nanospray dispenser and/or electron beam generator can be varied (in one, two, or three dimensions) by varying the position of the nanospray dispenser and/or electron beam generator, respectively, while maintaining the sample stage in a fixed position.

The system 100 can also include a processor and a memory for executing some or all of the imaging method steps described herein. While the following methods are described in relation to the system 100, it is understood that some or all steps of the method can be performed by other systems not disclosed herein, or that some or all steps of the method can be used to create other membranes similar to those described herein.

Figure 4:
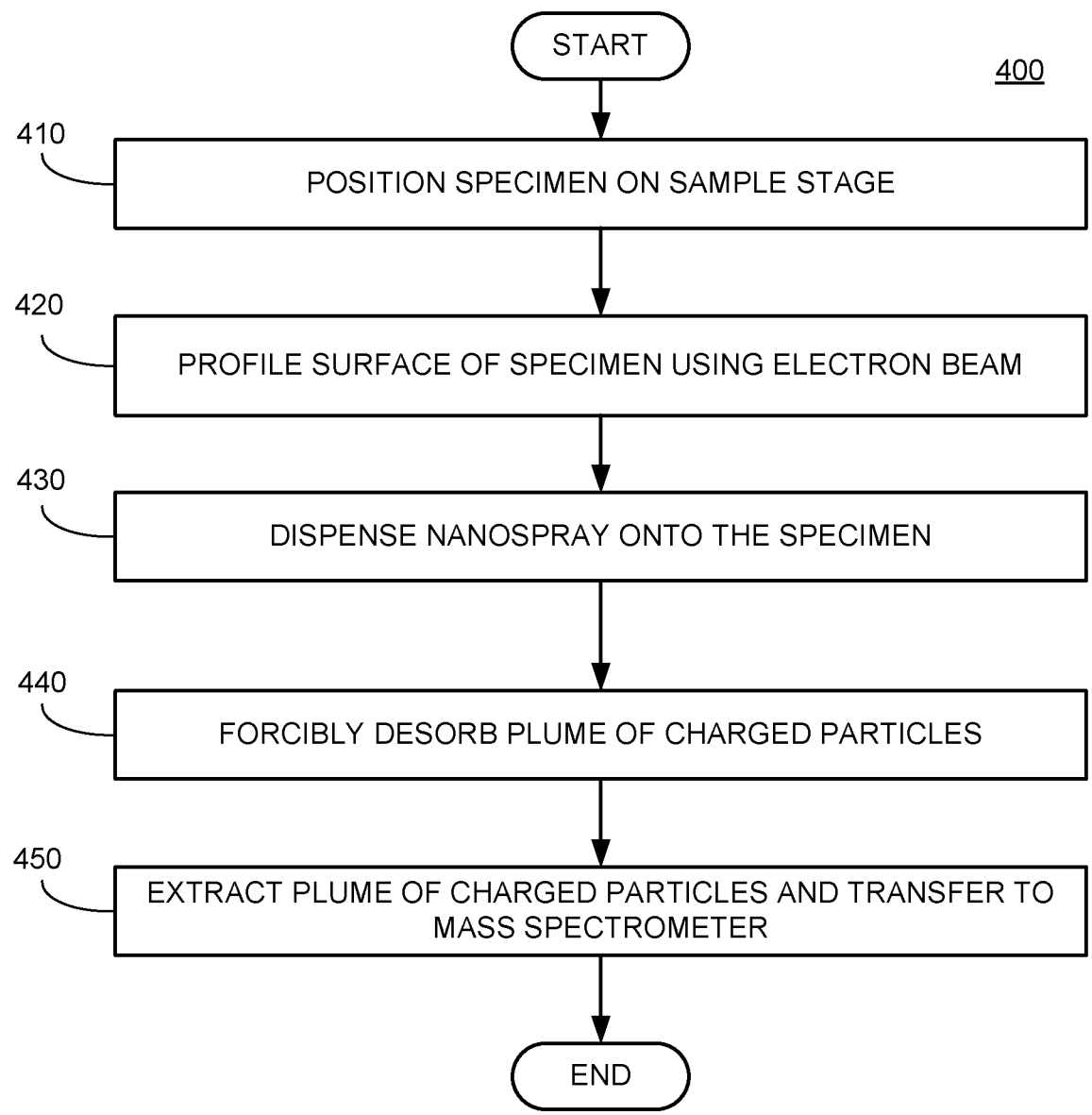
FIG. 4 illustrates a flowchart of a method of imaging a specimen according to some examples of the present disclosure.

FIG. 4 illustrates a flowchart of an example method 400 of imaging a specimen 160. As shown in block 410, the specimen 160 can be positioned on the sample stage 110 within the vacuum environment. The specimen 160 can be any plurality of biological cells. The method 400 can then proceed on to block 420.

In block 420, the electron beam generator 120 can utilize the electron beam to profile at least a portion of the surface of the specimen 160 to obtain the surface topology of the specimen 160. The electron beam can be focused on the first predetermined location on the specimen 160. The electron beam can profile the surface of the specimen 160 during a first time period or a second time period. The method 400 can then proceed on to block 430.

Figure 5A:
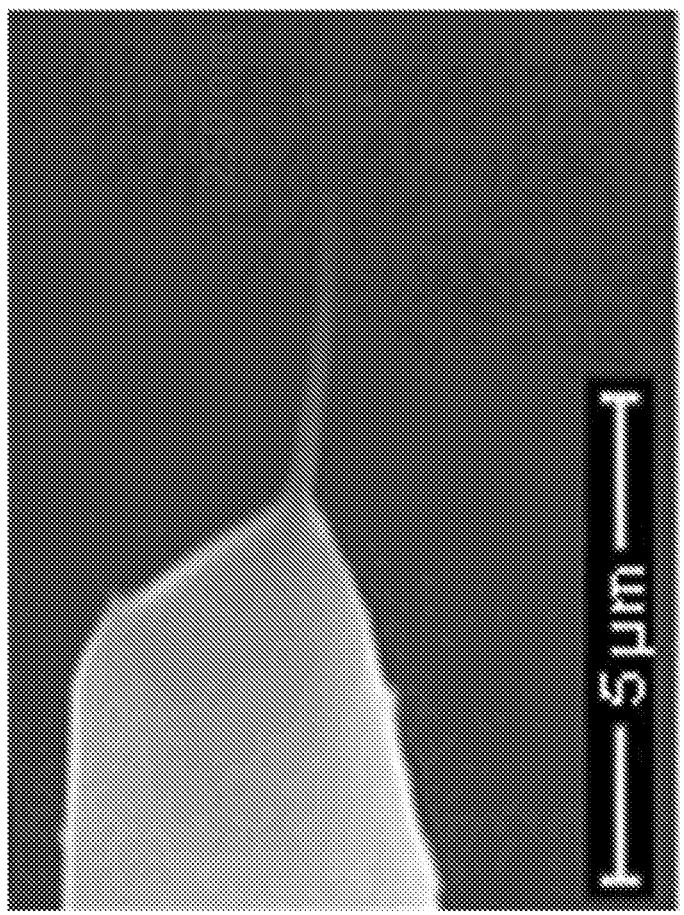
FIG. 5A is a scanning electron microscope (SEM) image of a nanospray dispenser according to some examples of the present disclosure.
Figure 5B:
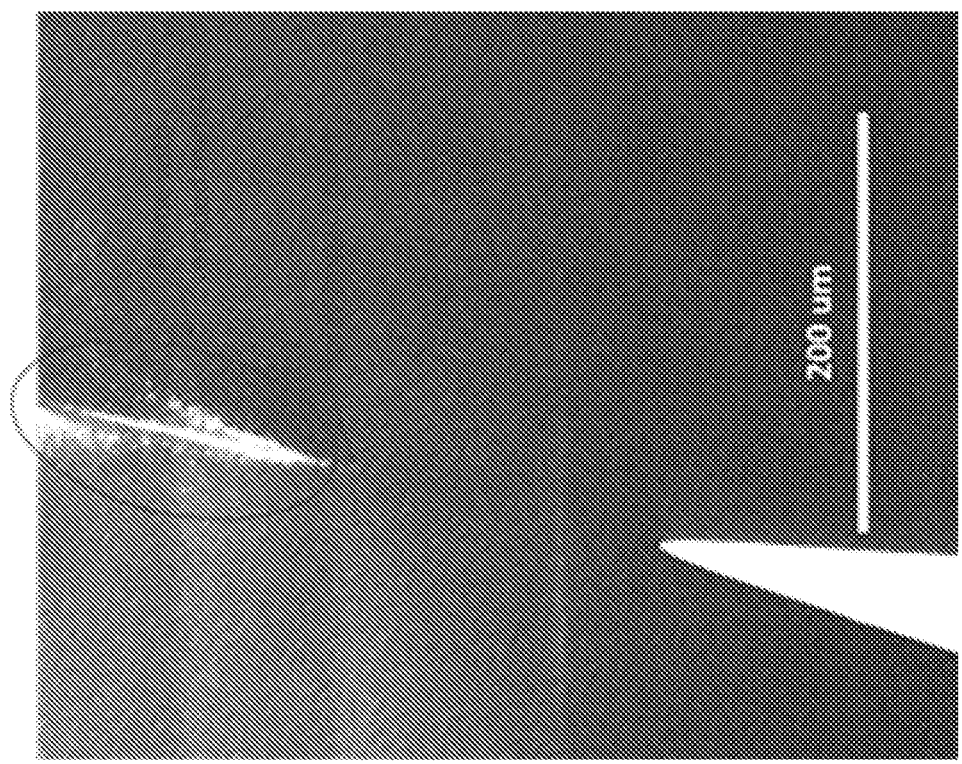
FIG. 5B is a scanning electron microscope (SEM) image of a nanospray dispenser according to some examples of the present disclosure.

In block 430, the nanospray can be dispensed from the nanospray dispenser 130 onto the second predetermined location on the specimen 160. The nanospray can be dispensed in conjunction with a transport gas. The nanospray can contact the specimen 160 during a first time period or a second time period. The nanospray dispenser 130 can also be configured such that the nanospray contacts the specimen in the form of a continuous filament, as shown in FIG. 5A. Alternatively, the nanospray dispenser 130 can also be configured such that the nanospray contacts the specimen in the form of a plurality of charged particles, as shown in FIG. 5B. The method 400 can then proceed on to block 440.

In block 440, a portion of the specimen 160 can be forcibly desorbed with the nanospray to create a plume of charged particles 210. The plume of charged particles 210 can be desolvated by the transport gas and fed into the extraction conduit 140. The extraction conduit 150 can utilize an electric field to extract the charged particles from the vacuum environment. The method 400 can then proceed on to block 450.

In block 450, the charged particles can be transferred from the vacuum environment and through the extraction conduit 150. The extraction conduit 150 can be in fluid communication with the mass spectrometer 140 and can further transfer the charged particles thereto. In such a manner, a map can be created of the specimen 160 using (i) the surface topology obtained by the electron beam and (ii) the chemical composition obtained by the plume of charged particles analyzed by the mass spectrometer. The method 400 can then terminate or proceed on to other method steps not shown.

Certain embodiments and implementations of the disclosed technology are described above with reference to block and flow diagrams of systems and methods and/or computer program products according to example embodiments or implementations of the disclosed technology. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, may be repeated, or may not necessarily need to be performed at all, according to some embodiments or implementations of the disclosed technology.

While the present disclosure has been described in connection with a plurality of exemplary aspects, as illustrated in the various figures and discussed above, it is understood that other similar aspects can be used, or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims.

What is claimed is:

1. A specimen imaging system comprising:
   a sample stage in a vacuum environment configured to support a specimen;
   an electron beam generator configured to generate an electron beam and focus the electron beam on a first predetermined location on the specimen;
   a nanospray dispenser configured to dispense a nanospray having an energy per impacting molecule of 1 eV or less onto a second predetermined location on the specimen;
   a mass spectrometer; and
   an extraction conduit in fluid communication with the mass spectrometer and configured to extract a plume of charged particles generated as a result of contact between the nanospray and the specimen and deliver the charged particles to the mass spectrometer.

2. The specimen imaging system of claim 1, wherein the first predetermined location is a different location than the second predetermined location.

3. The specimen imaging system of claim 1, wherein the electron beam generator is positioned above the sample stage.

4. The specimen imaging system of claim 1, wherein the nanospray dispenser is oriented towards to the sample stage.

5. The specimen imaging system of claim 1, wherein the nanospray dispenser and the electron beam generator are further configured to, simultaneously:
   dispense the nanospray onto the second predetermined location of the specimen; and
   focus the electron beam onto the first predetermined location of the specimen.

6. The specimen imaging system of claim 1, wherein the nanospray dispenser is further configured to dispense the nanospray onto the second predetermined location of the specimen during a first time period;
   wherein the electron beam generator is further configured to focus the electron beam onto the first predetermined location of the specimen during a second time period; and
   wherein the first time period is different than the second time period.

7. The specimen imaging system of claim 1, wherein the nanospray dispenser is further configured to dispense a nanospray onto the second predetermined location, such that the nanospray contacts the specimen as a charged, continuous liquid filament.

8. A specimen imaging system comprising:
a sample stage in a vacuum environment, the sample stage configured to support a specimen;
an electron beam generator configured to generate an electron beam and focus the electron beam on a first predetermined location on the specimen during a first time period;
a nanospray dispenser configured to dispense a nanospray onto a second predetermined location on the specimen during a second time period;
a mass spectrometer; and
an extraction conduit in fluid communication with the mass spectrometer and configured to extract a plume of charged particles generated as a result of contact between the nanospray and the specimen and deliver the charged particles to the mass spectrometer.

9. The specimen imaging system of claim 8, wherein the nanospray dispenser is further configured to dispense a transport gas laterally across the sample stage, such that the transport gas carries at least a portion of the specimen that is forcibly desorbed from the specimen by the nanospray toward the extraction conduit.

10. The specimen imaging system of claim 9, wherein the nanospray dispenser comprises a first outlet for ejecting the nanospray and a second outlet for ejecting the transport gas.

11. The specimen imaging system of claim 8, wherein the specimen comprises one or more biological cells;
wherein either:
the first predetermined location is a same location as the second predetermined location; or
the first predetermined location is a different location than the second predetermined location;
wherein either:
the first time period is a same time period as the second time period such that the generating and the dispensing are simultaneous; or
the first time period is a different time period that the second time period;
wherein either:
the nanospray dispenser is further configured to dispense a nanospray onto the second predetermined location such that the nanospray contacts the specimen as a charged, continuous liquid filament; or
the nanospray dispenser is further configured to dispense a nanospray onto the second predetermined location such that the nanospray contacts the specimen as charged droplets;
wherein the electron beam generator is positioned above the sample stage; and
wherein the nanospray dispenser is oriented towards to the sample stage.

12. The specimen imaging system of claim 11, wherein the nanospray dispenser is further configured to:
cause the nanospray to forcibly desorb a portion of the specimen; and
dispense the nanospray having an energy per impacting molecule of 1 eV or less.

13. The specimen imaging system of claim 12, wherein the extraction conduit is further configured to receive the portion of the specimen forcibly desorbed and transfer at least a portion of the specimen forcibly desorbed to the mass spectrometer.

14. A method of imaging a specimen comprising:
profiling at least a portion of a surface of a specimen within a vacuum environment with an electron beam focused on a first predetermined location on the specimen to obtain a surface topology;
dispensing a nanospray onto a second predetermined location on the specimen; and
transferring charged particles from a desorbed portion of the specimen to a mass spectrometer.

15. The method of claim 14, wherein the nanospray has an energy per impacting molecule of 1 eV or less; and
wherein either:
the first predetermined location is a same location as the second predetermined location; or
the first predetermined location is a different location than the second predetermined location.

16. The method of claim 15, wherein the specimen is positioned on a sample stage within the vacuum environment;
wherein the electron beam is from an electron beam generator positioned above the sample stage;
wherein the nanospray is dispensed from a nanospray dispenser;
wherein the desorbed portion of the specimen is forcibly desorbed with the nanospray; and
wherein the charged particles are transferred from the vacuum environment into an extraction conduit in fluid communication with the mass spectrometer.

17. The method of claim 16, wherein the nanospray dispenser is oriented towards to the sample stage.

18. The method of claim 16 further comprising dispensing a transport gas laterally across the sample stage, such that the transport gas carries at least a portion of the desorbed portion of the specimen toward the extraction conduit.

19. The method of claim 15 further comprising analyzing at least a portion of the desorbed portion of the specimen with the mass spectrometer to determine a chemical composition of the specimen at the second predetermined location.

20. The method of claim 14, wherein the nanospray has an energy per impacting molecule from 0.001 eV to 1 eV.

* * * * *